(12) United States Patent
Murray

(10) Patent No.: US 8,483,776 B2
(45) Date of Patent: Jul. 9, 2013

(54) ACOUSTIC PATH FOR A WIRELESS COMMUNICATIONS DEVICE

(75) Inventor: Matthew Justin Murray, Raleigh, NC (US)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 1635 days.

(21) Appl. No.: 11/191,108

(22) Filed: Jul. 27, 2005

(65) Prior Publication Data

US 2007/0026905 A1 Feb. 1, 2007

(51) Int. Cl.
| | |
|---|---|
| H04B 1/38 | (2006.01) |
| H04M 1/00 | (2006.01) |
| H04M 9/00 | (2006.01) |
| H05K 5/00 | (2006.01) |
| H01Q 1/24 | (2006.01) |
| H04R 25/00 | (2006.01) |
| H04R 9/08 | (2006.01) |
| H04R 11/04 | (2006.01) |
| H04R 17/02 | (2006.01) |
| H04R 19/04 | (2006.01) |
| H04R 21/02 | (2006.01) |
| H01R 3/00 | (2006.01) |

(52) U.S. Cl.
USPC .... 455/570; 455/90.1; 455/550.1; 455/575.1; 181/156; 343/702; 379/430; 379/433.13; 381/322; 381/355; 381/365; 439/500

(58) Field of Classification Search
USPC ............. 455/90.1, 90.3, 550.1, 552.1, 566, 455/569.1, 570, 575.1, 575.3, 575.5, 556.1, 455/573; 181/21, 145, 156, 158, 160, 258; 381/151, 152, 337, 338, 345, 351, 352, 160, 381/355, 356, 360, 369, 175, 375, 150, 170, 381/174, 312, 353, 357, 361, 365, 386; 379/420.01, 420.02, 429, 430, 432, 433.02, 379/433.03, 433.13, 434
See application file for complete search history.

(56) References Cited

U.S. PATENT DOCUMENTS

| | | | | |
|---|---|---|---|---|
| 5,890,072 | A * | 3/1999 | Rabe | 455/550.1 |
| 5,913,178 | A * | 6/1999 | Olsson | 455/575.3 |
| 5,915,015 | A * | 6/1999 | Thornton | 379/433.13 |
| 6,091,964 | A * | 7/2000 | Frohlund | 455/575.3 |
| 7,092,745 | B1 * | 8/2006 | D'Souza | 455/575.1 |

(Continued)

FOREIGN PATENT DOCUMENTS

| | | |
|---|---|---|
| CN | 1444372 A | 9/2003 |
| EP | 0 840 396 | 5/1998 |

(Continued)

OTHER PUBLICATIONS

PCT International Search Report, International Application No. PCT/US2006/007434, Mailed Jun. 30, 2006.

(Continued)

Primary Examiner — Andrew Wendell
Assistant Examiner — Paul P Tran
(74) Attorney, Agent, or Firm — Coats & Bennett, P.L.L.C.

(57) ABSTRACT

A printed circuit board for a wireless communications device includes an acoustic path, and acoustically couples microphone circuitry mounted to a surface of the printed circuit board to an exterior of the wireless communications device. A portion of the acoustic path is integrally formed with the printed circuit board and extends generally parallel to the surface of the printed circuit board. One end of the acoustic path is disposed proximate the microphone circuitry and an opposing end opens to receive acoustic sound from the exterior of the wireless communications device. Audible sound propagates through the acoustic path to the microphone circuitry.

21 Claims, 5 Drawing Sheets

U.S. PATENT DOCUMENTS

| | | | |
|---|---|---|---|
| 7,136,625 B2 * | 11/2006 | Ylitalo et al. | 455/90.3 |
| 7,349,723 B2 * | 3/2008 | MacIntosh et al. | 455/575.1 |
| 2002/0102004 A1 | 8/2002 | Minervini | |
| 2003/0064687 A1 * | 4/2003 | Sugino et al. | 455/90 |
| 2003/0103641 A1 | 6/2003 | Marten | |
| 2004/0184632 A1 * | 9/2004 | Minervini | 381/355 |
| 2005/0105749 A1 | 5/2005 | Niederdrank et al. | |
| 2006/0104469 A1 * | 5/2006 | Hawker et al. | 381/365 |

FOREIGN PATENT DOCUMENTS

| | | |
|---|---|---|
| EP | 1 530 401 | 5/2005 |
| GB | 2 386 281 | 9/2003 |
| GB | 2386281 A | 9/2003 |
| JP | H07202997 A | 4/1995 |
| JP | H08097895 A | 12/1996 |
| WO | WO 03/103334 | 12/2003 |
| WO | 2004004408 A1 | 1/2004 |

OTHER PUBLICATIONS

First Office Action issued Aug. 3, 2010 in re Chinese Patent Application No. 200680026935.0 filed Mar. 2, 2006.

* cited by examiner

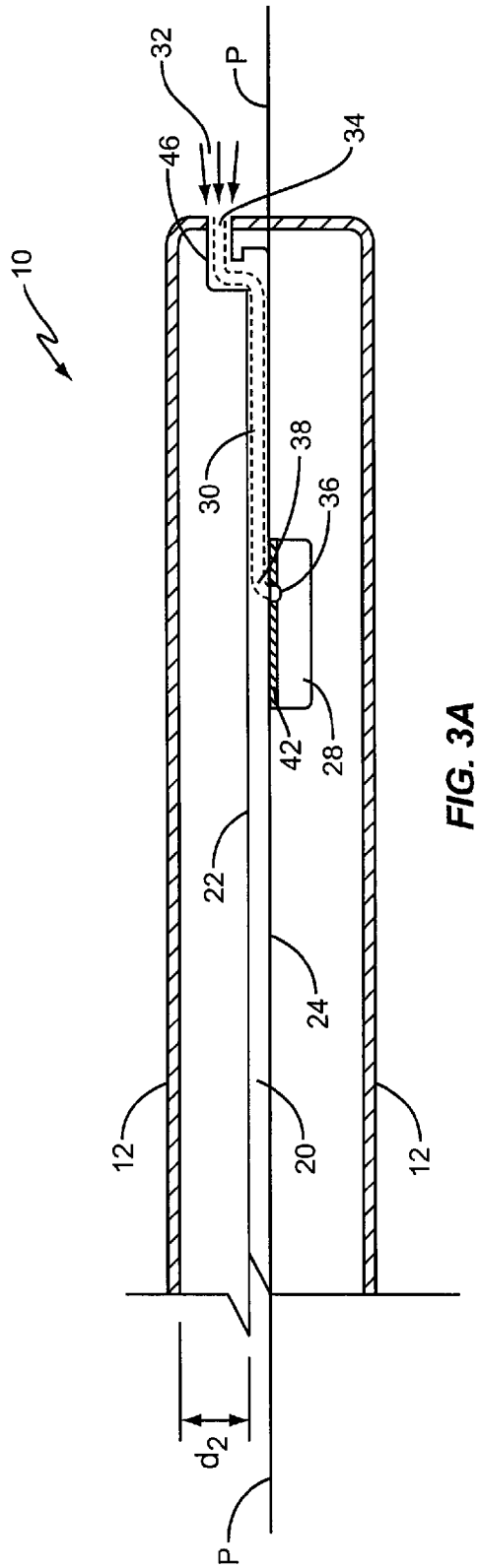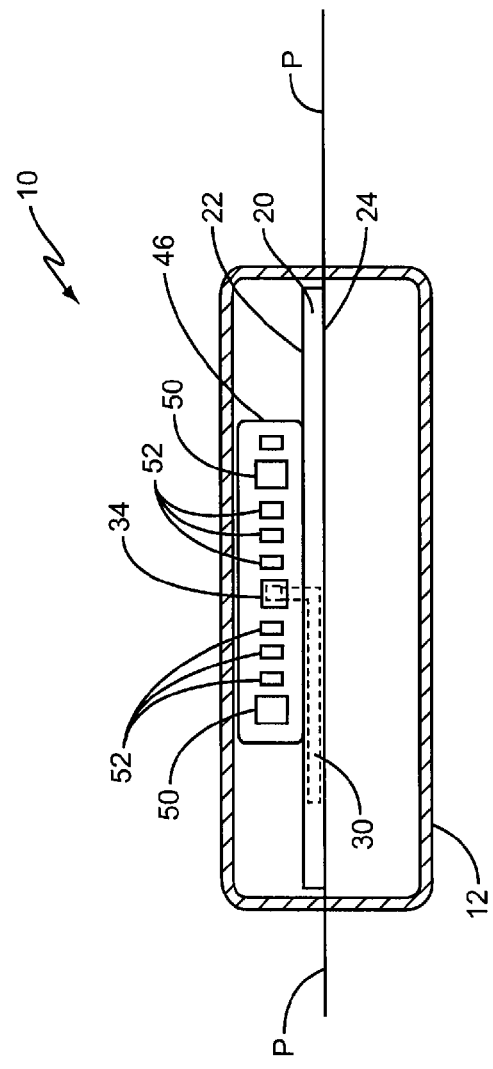
FIG. 3A
FIG. 3B

ACOUSTIC PATH FOR A WIRELESS COMMUNICATIONS DEVICE

BACKGROUND

The present invention relates generally to wireless communications devices, and particularly to wireless communications devices that employ surface-mountable transducers.

Conventionally, a microphone or microphone circuitry is mounted on a printed circuit board (PCB) contained within a housing of the wireless communications device. Audible sound, such as speech, enters through a hole formed in the housing and propagates to the microphone down an acoustic path. In conventional devices, the acoustic path is formed by a grommet or like device positioned between the microphone and the interior surface of the housing. The grommet acts as a seal that permits audible sound from the exterior of the wireless communications device to propagate to the microphone, while preventing other audible sounds, such as those produced by a speaker in the device, from reaching the microphone and causing undesirable feedback.

Because the grommet defines the acoustic path, it imposes certain design limitations. For example, the grommet has physical dimensions that define a minimum spatial separation between the PCB and the housing. This separation generally hinders efforts to reduce the overall size of wireless communications devices. Further, the acoustic path is perpendicular to a surface of the PCB. Therefore, prior art wireless communications devices position the PCB and the housing such that the microphone, the acoustic path, and the hole in the housing, directly align with each other. Additionally, grommets are usually installed manually during the manufacturing process, which results in increased manufacturing costs that are ultimately passed to the consumer.

SUMMARY

A wireless communications device comprises a printed circuit board (PCB). The PCB includes one or more substrate layers having conductive traces and microphone circuitry mounted to one surface. An acoustic path is integrally formed with the PCB and extends from the microphone to acoustically couple the microphone to the exterior of the wireless communications device. For example, one end of the acoustic path may be disposed proximate an acoustic port on the microphone, while an opposing end of the acoustic path may be disposed proximate an opening on a connector mounted to the PCB.

According to the present invention, audible sound, such as a user's speech, enters the wireless communications device through the connector opening and propagates through the acoustic path to the microphone. At least a portion of the acoustic path is formed to extend generally parallel to the surface of the PCB. In one embodiment, the generally parallel portion of the acoustic path is formed as a channel that extends through the interior of the PCB. In an alternate embodiment, the generally parallel portion of the acoustic path is formed as an acoustical waveguide that extends along a surface of the PCB.

BRIEF DESCRIPTION OF THE DRAWINGS

FIG. 3A is a side-sectional view illustrating a printed circuit board for a wireless communications device configured according to one embodiment of the present invention.

FIG. 3B is an end-view illustrating how a connector of the wireless communications device might be configured according to the embodiment of FIG. 3A.

DETAILED DESCRIPTION

Figure 1:
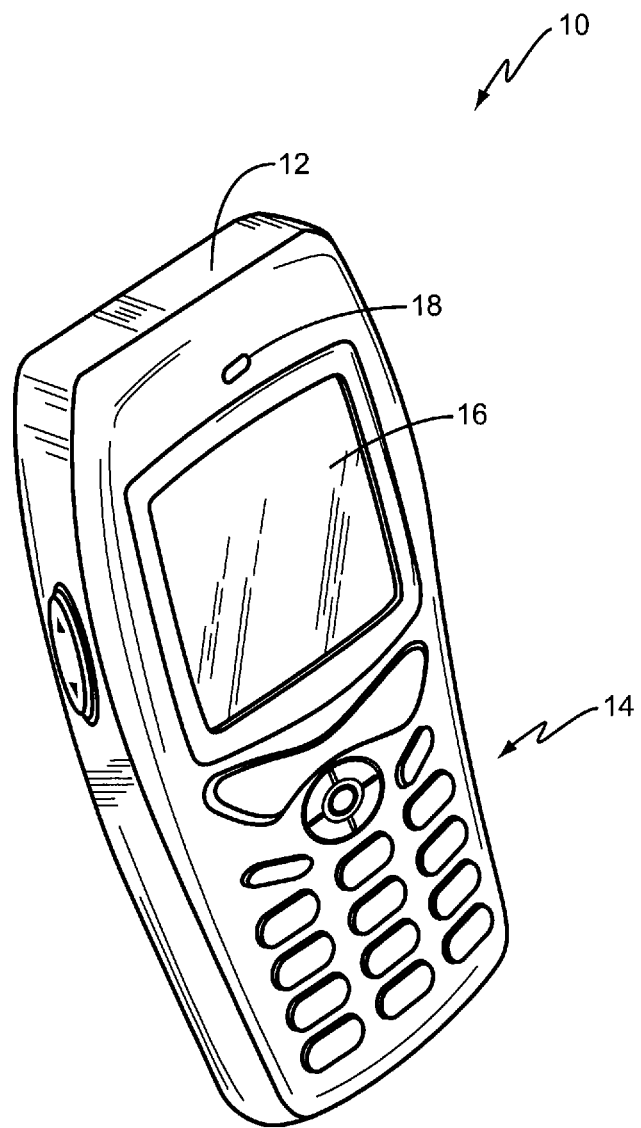
FIG. 1 is a perspective view that illustrates a type of wireless communications device that may be configured according to one embodiment of the present invention.

Referring now to the drawings, a type of wireless communications device that is suitable to be configured according to one embodiment of the present invention is shown therein and indicated generally by the number 10. It should be noted that the figures and the specification describe wireless communications device 10 in terms of a cellular telephone; however, this is merely for illustrative purposes. Those skilled in the art will readily appreciate that the present invention is applicable to any consumer electronics device including, but not limited to, Personal Digital Assistants (PDAs), satellite telephones, Personal Communication Services (PCS) devices, palm computers, and the like.

As seen in FIG. 1, wireless communications device 10 comprises a housing 12, a user interface 14, a display 16, and a speaker 18. Housing 12 typically contains a variety of electronics components and circuitry mounted to a printed circuit board (PCB). As is known in the art, the components and circuitry may include a wireless transceiver operating according to any known standard that allows a user to communicate with one or more remote parties via a wireless communications network. User interface 14 is disposed on a face of housing 12 and provides a user with the necessary elements to interact with wireless communications device 10. For example, the user may dial numbers, enter commands, and select options from menu systems. In this embodiment, user interface 14 includes a variety of controls including a keypad, a joystick or navigational disk, and various control buttons; however, other types of controls may also be employed in addition to, or in lieu of, the illustrated controls as needed or desired. Display 16 permits users to view dialed digits, call status, menu options, and service information typically associated with wireless communications devices. If wireless communications device 10 is equipped with a camera (not shown), display 16 may also act as a viewfinder. Speaker 18 may comprise any transducer known in the art that renders audible sound to the user.

Figure 2:
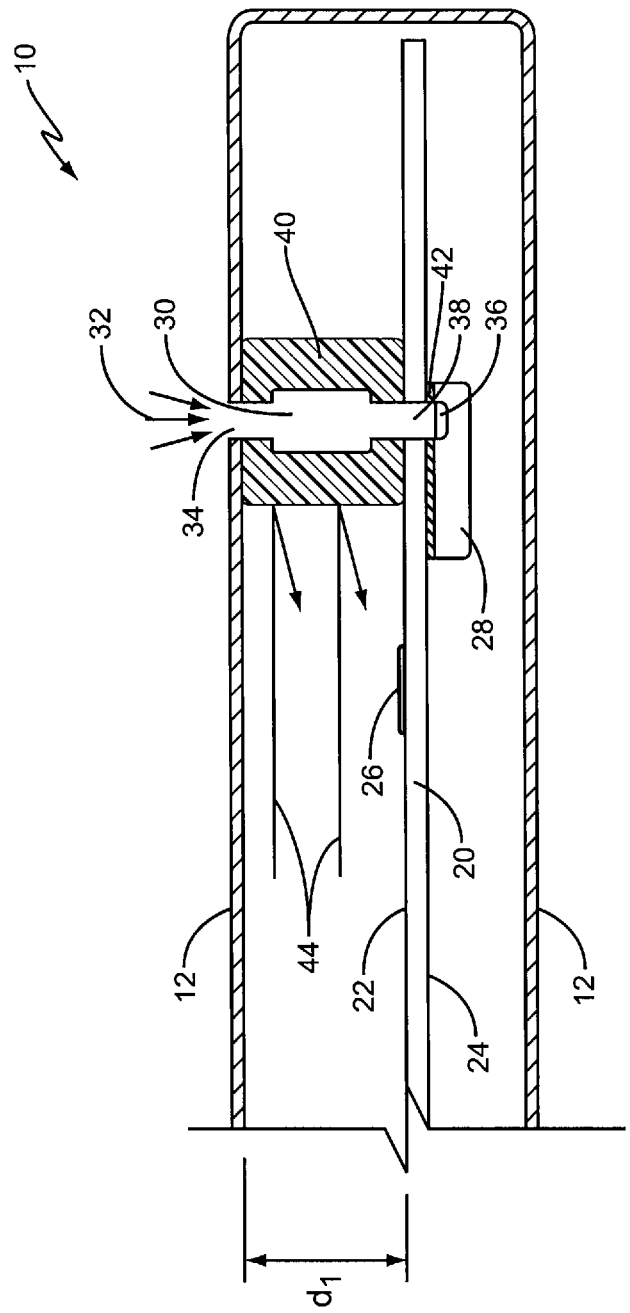
FIG. 2 is a side-sectional view that illustrates a conventionally configured wireless communications device.

FIG. 2 illustrates a sectional view of wireless communications device 10 as it might be configured according to the prior art. In FIG. 2, housing 12 carries a PCB 20 having first and second surfaces 22, 24. One or more conductive traces 26 may be disposed on PCB 20 to electrically conduct various electrical signals to and from a variety of electronic components. One such electronic component is microphone 28. As seen in the figures, microphone 28 is a surface mounted device (SMD) commonly referred to as a "zero-height Silicon microphone." However, other types of microphones may also be employed, such as those commonly referred to as "electret condenser microphones" (ECM). Both types of microphones, and others similar to them, are commonly used in wireless communications devices and convert the user's speech and other audible sound into electrical signals. The converted electrical signals may then be transmitted to one or more remote parties, for example.

An acoustical path 30 permits audible sound, indicated by the multiple arrows 32, to propagate to microphone 28. Particularly, audible sound 32 enters acoustical path 30 through an opening 34 in housing 12, and contacts an acoustical port 36 through an opening 38 in PCB 20. A sealing member 40, PCB 20, and solder seal 42 cooperate to define the bounds of acoustical path 30. Sealing member 40 may be, for example, a grommet or gasket manufactured from a compressible material such as rubber or foam. Solder seal 42 is disposed between microphone 28 and PCB 20. Sealing member 40 and solder seal 42 are important considerations for conventional wireless communications devices, as they reduce acoustic coupling between microphone 28 and audible sound 44 rendered by speaker 18. Reducing acoustic coupling minimizes the amount of acoustic echo a user might experience while using wireless communications device 10, and might, to some degree, affect the frequency response of microphone 28.

However, as seen in FIG. 2, sealing member 40 also places some undesirable constraints on the design and manufacturing processes of conventional devices. For example, sealing member 40 has physical dimensions that include a height. Thus, the inclusion of sealing member 40 in conventional devices may result in a spatial separation between PCB 20 and housing 12, indicated in FIG. 2 by $d_1$.

Moreover, sealing member 40, such as the one seen in FIG. 2, may define an acoustic path 30 that is generally perpendicular to first surface 22 of PCB 20. In these cases, acoustic port 36 must align with openings 34 and 38. Other sealing members may define a "bent" acoustic channel. In these cases, acoustic port 36 would not have to directly align with openings 34 and 38. However, the mechanical tolerances of these types of sealing members might degrade the acoustical properties of the acoustic channel. In addition, the manual labor required to place these types of sealing members between housing 12 and PCB 20 adds to the cost of manufacturing the wireless communications device 10.

According to the present invention, the need for having a sealing member 40 is removed by re-routing the acoustic path 30. FIGS. 3A and 3B, for example, illustrate one embodiment of the present invention wherein at least a portion of the acoustic path 30 is disposed generally parallel to a plane P defined by the first or second surfaces 22, 24 of PCB 20. As seen in FIG. 3A, the present invention may reduce the spatial separation between PCB 20 and housing 12 from the distance $d_1$ to a distance of $d_2$.

In FIGS. 3A-3B, acoustic path 30 is formed as a channel, which may have one or more bends or turns, and extends at least partially through the interior of PCB 20. In this embodiment, the PCB 20 itself may prevent internal airborne acoustic coupling caused by audible sound 44 rendered by speaker 18, and thus, no sealing member 40 is required. Further, because a portion of the acoustic path 30 is generally parallel to the plane P, there is no need to ensure that openings 34 and 38 will align with each other and with acoustic port 36. Thus, microphone 28 may be positioned as desired on PCB 20. Opening 38 is still positioned proximate acoustic port 36; however, as seen in FIG. 3B, opening 34 may be formed in a connector 46 of wireless communications device 10.

Connector 46 may be, for example, a systems interface connector that permits a user to connect wireless communications device 10 to one or more accessory devices. These accessory devices include, but are not limited to, hands-free headsets (not shown) and battery chargers (not shown). Typically, connectors 46 include a plurality of contact pins 52 and one or more guide members 50. The contact pins 52 contact corresponding pins on a selected accessory device, and electrically couple the accessory to the wireless communications device 10. The guide members 50 receive a corresponding guide member associated with the accessory device being connected, and may include known retaining mechanisms to maintain the accessory in electrical contact with connector 46.

However, when an accessory device is not connected to wireless communications device 10, guide members 50 are not in use. Therefore, one or more of these guide members 50 may be used as the opening 34 that defines the opposing end of the acoustic path 30. Particularly, guide member 50 and an interior portion of connector 46 may be hollow. An end of acoustic path 30 could butt against the hollowed portion of the connector 46. If desired, any intersection between the acoustic path 30 and connector 46 could be sealed using solder, for example. Audible sound 32 may enter the opening 34 in the connector 46, and propagate through acoustic path 30 to microphone 28.

Figure 4:
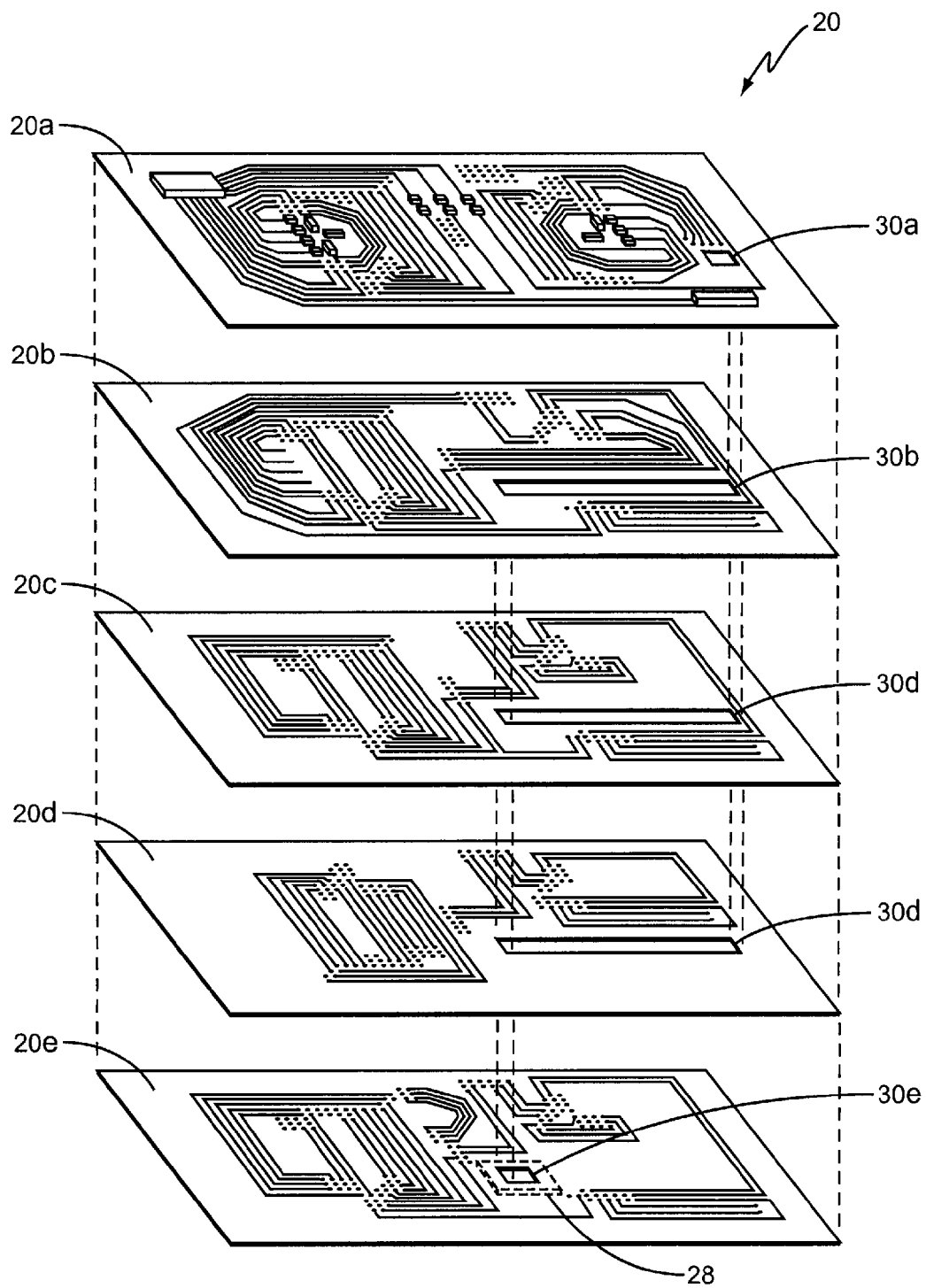
FIG. 4 is an exploded view of a printed circuit board configured according to one embodiment of the present invention.

Acoustic path 30 may be formed such that it extends generally parallel to plane P in any number of ways. In one embodiment, for example, acoustic path 30 is formed during the manufacture process of PCB 20. As seen in FIG. 4, PCB 20 may comprise a plurality of substrate layers 20a-20e. FIG. 4 illustrates PCB 20 as having five substrate layers; however, PCB 20 may be comprised of any number of substrate layers. As known in the art, substrate layers are dielectric layers that may be constructed, for example, from a fiberglass reinforced epoxy material. However, it should be understood that any rigid or flexible material used to construct PCB 20 is suitable for the purposes of the present invention.

Each of the substrate layers 20a-20e may further include one or more conductive traces 26 formed by any of a number of well-known processes, such as "etching," for example. As known in the art, sheets of conductive foil, such as copper, may be glued to the sides of substrate layers 20a-20e. Chemicals or lasers, for example, are then employed to "etch" the substrate layers 20a-20e and remove unwanted copper. The copper remaining on the substrate layers 20a-20e form the conductive traces 26.

As previously stated, conductive traces 26 conduct electrical signals to and from various electrical components soldered or otherwise connected to PCB 20. For example, the components may be connected to PCB 20 using a technology known as surface mount technology (SMT). SMT is a technology where surface mounted devices (SMD), such as microphone 28, for example, are placed on conductive pads of PCB 20. The conductive pads may be coated with a thin layer of a temporary adhesive, such as solder paste, to hold the SMD in place. The PCB 20 and the SMDs are then placed in a convection oven to melt the solder and connect the SMD to the PCB 20. The PCB 20 is then allowed to cool, which solidifies the solder and affixes the SMDs to PCB 20.

In FIG. 4, substrate layers 20a-20e also include one or more cutouts 30a-30e. Cutouts 30a-30e comprise longitudinal cross-sections of acoustic path 30. When the multiple substrate layers 20a-20e of PCB 20 are connected together, the cutouts 30a-30e align to form the acoustic path 30 as a channel. Substrate layers 20a-20e may be connected, for example, by disposing rivets or other mechanical fasteners through drill holes in the substrate layers 20a-20e, referred to in the art as "vias." However, other methods may be also be used to connect substrate layers 20a-20e.

Figure 5:
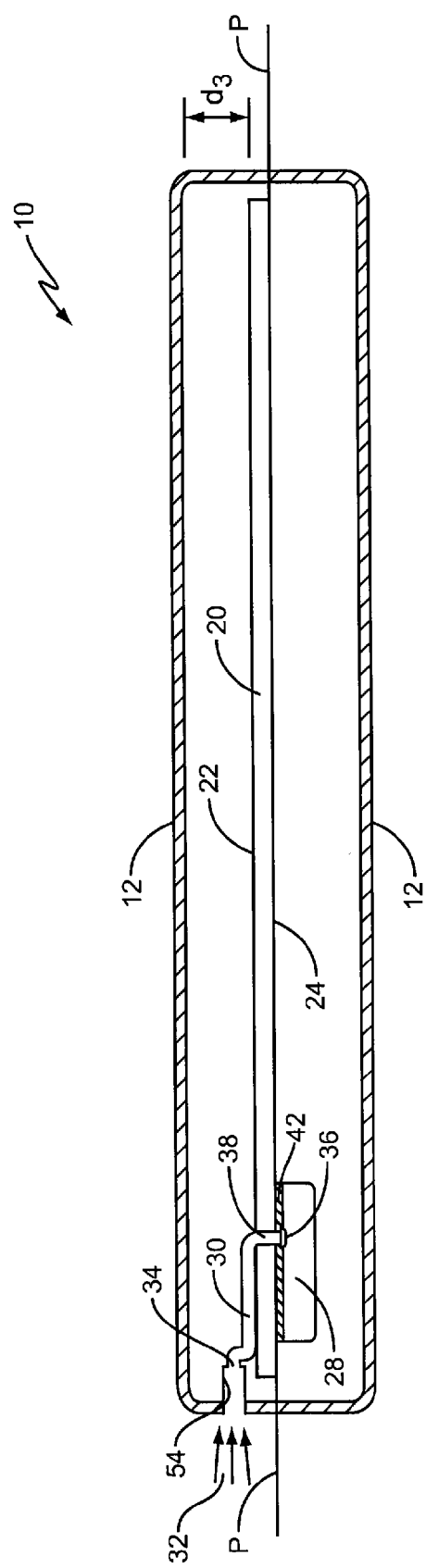
FIG. 5 is a side-sectional view illustrating a printed circuit board for a wireless communications device configured according to an alternate embodiment of the present invention.

FIG. 5 illustrates an alternate embodiment of the present invention wherein acoustic path 30 does not extend through the interior of PCB 20 but, instead, extends at least partially along the first surface 22 of PCB 20. In this embodiment, acoustic path 30 is formed as a waveguide that acoustically connects microphone 28 to the exterior of wireless communications device 10. The waveguide might be constructed, for example, from a metal such as copper, and affixed to first surface 22. Opening 38 is proximate the acoustic port 36 of microphone 28, which is mounted to the second surface 24, while opening 34 is formed as a hole in female connector 54. In this embodiment, female connector 54 comprises a jack that receives a barrel plug type connector (not shown) attached to an accessory device, for example. Audible sound, shown by the arrows 32, enters the connector 54 and propagates down acoustic path 30 to microphone 28.

As in the previous embodiment, there is no need for sealing member 40 in the embodiment of FIG. 5. Therefore, this embodiment may reduce the spatial separation $d_1$ consistent with some conventional designs to a distance of $d_3$. Acoustic path 30 is substantially sealed and, thus, prevents acoustic coupling caused by audible sound 44 rendered by speaker 18. In addition, acoustic path 30 may be constructed of a plurality of materials. The material used for the interior of acoustic path 30, for example, could facilitate propagation of audible sound waves, while the material used for the exterior of acoustic path 30 could inhibit the propagation of audible sound waves. Further, the openings 34, 38 could be soldered or otherwise connected to connector 54 and first surface 22 to substantially prevent audible sound waves from breaching any gaps between acoustic path 30 and connector 54 and/or PCB 20.

Those skilled in the art will readily appreciate that the acoustic path 30 could be constructed such that it advantageously conditions the acoustic input. For example, acoustic path 30 could be constructed to be of any desired length, volume, or shape, to provide a desired resonance or other conditioning to the acoustic input. Further, acoustic path 30 might also be routed such that it extends both with the interior of PCB 20, and along one or both of the first and second surfaces 22, 24. Thus, the present invention may comprise an acoustic path 30 that is a combination of a channel formed through PCB 20, and a waveguide extending along the first and/or second surface 22, 24. In addition, acoustic path 30 need not be formed from cutouts in one or more substrate layers. Those skilled in the art will realize that acoustic path 30 may be defined by an appropriately sealed spatial separation between two or more PCBs. Further, acoustic path 30 may extend along either or both the first and second surfaces 22, 24 of PCB 20 regardless of the position of microphone 28 on PCB 20. However, at least part of the acoustic path 30 extends generally parallel to the plane P.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A wireless communications device comprising:
   a printed circuit board;
   microphone circuitry mounted to a first surface of the printed circuit board;
   an acoustic path acoustically coupling the microphone circuitry to an exterior of the wireless communications device, at least a portion of the acoustic path being integrally formed with the printed circuit board and extending generally parallel to a plane defined by the first surface of the printed circuit board; and
   an opening formed at one end of the acoustic path that opens to acoustically couple the microphone circuitry to the exterior of the wireless communications device, wherein the opening is formed in a connector of the wireless communications device.

2. The wireless communications device of claim 1 wherein an opposing end of the acoustic path is disposed proximate an acoustic port of the microphone circuitry.

3. The wireless communications device of claim 2 wherein the acoustic path forms an acoustic waveguide that propagates audible sound from the opening to the acoustic port.

4. The wireless communications device of claim 1 wherein the connector comprises a pin connector.

5. The wireless communications device of claim 1 wherein the connector comprises a female connector.

6. The wireless communications device of claim 1 wherein the portion of the acoustic path integrally formed with the printed circuit board comprises a channel that extends through an interior of the printed circuit board.

7. The wireless communications device of claim 1 wherein the acoustic path comprises an acoustical waveguide that extends along a second surface of the printed circuit board.

8. A printed circuit board comprising:
   at least one substrate layer having one or more conductive traces; and
   an acoustic path integrally formed with the printed circuit board such that a portion of the acoustic path extends generally parallel to a plane defined by a first surface of the printed circuit board, the acoustic path including an opening formed at one end that receives acoustic input from an exterior of a wireless communications device, wherein the opening is formed in a connector mounted to the printed circuit board.

9. The printed circuit board of claim 8 wherein an opposing end of the acoustic path is disposed proximate microphone circuitry associated with the at least one substrate layer.

10. The printed circuit board of claim 9 wherein the acoustic path acoustically couples the acoustic input to the microphone circuitry.

11. The printed circuit board of claim 8 wherein the connector comprises a pin connector.

12. The printed circuit board of claim 8 wherein the connector comprises a female connector.

13. The printed circuit board of claim 8 wherein the printed circuit board comprises a plurality of substrate layers, and wherein the portion of the acoustic path forms a channel that extends through an interior of the printed circuit board to acoustically couple microphone circuitry mounted to the surface of the printed circuit board to the exterior of the wireless communications device.

14. The printed circuit board of claim 8 wherein the portion of the acoustic path comprises an acoustical waveguide that extends along a surface of the printed circuit board to acoustically couple microphone circuitry to the exterior of the wireless communications device.

15. The printed circuit board of claim 14 wherein the surface comprises the first surface.

16. The printed circuit board of claim 14 wherein the surface comprises a second surface opposite the first surface.

17. A method of assembling a printed circuit board for a wireless communications device comprising:
   providing one or more conductive traces on at least one substrate layer that forms the printed circuit board; and
   forming an acoustic path proximate the at least one substrate layer such that a portion of the acoustic path is integrally formed with the printed circuit board and extends generally parallel to a plane defined by a first surface of the printed circuit board, wherein forming an acoustic path comprises:

extending an acoustical waveguide member along a second surface of the printed circuit board;

disposing one end of the acoustic path proximate microphone circuitry mounted to the first surface of the printed circuit board; and disposing an opposing end of the acoustic path at a connector mounted to the printed circuit board.

18. The method of claim 17 wherein the printed circuit board comprises a plurality of substrate layers, and wherein forming an acoustic path comprises forming the plurality of substrate layers to include a cutout of the acoustic path.

19. The method of claim 18 further comprising connecting the plurality of substrate layers by aligning each of the cutouts to form an acoustical channel that extends through an interior of the printed circuit board.

20. The method of claim 17 wherein the connector comprises a pin connector mounted to the printed circuit board.

21. The method of claim 17 wherein the connector comprises a female connector mounted to the printed circuit board.

* * * * *